United States Patent [19]

Yada

[11] Patent Number: 5,760,642

[45] Date of Patent: Jun. 2, 1998

[54] FILTER CIRCUIT USING A JUNCTION CAPACITOR OF A SEMICONDUCTOR

[75] Inventor: Toshiro Yada, Tokyo, Japan

[73] Assignee: Mitsubishi Denki Kabushiki Kaisha, Tokyo, Japan

[21] Appl. No.: 733,150

[22] Filed: Oct. 16, 1996

[30] Foreign Application Priority Data

May 7, 1996 [JP] Japan .................................. 8-112659

[51] Int. Cl.⁶ ........................................................ H03K 5/00
[52] U.S. Cl. ........................ 327/558; 327/552; 327/311; 327/559; 333/172; 330/303
[58] Field of Search .............................. 327/552, 558, 327/559, 581, 583, 586, 478, 311, 567, 564, 504, 333; 333/173, 172; 330/303

[56] References Cited

FOREIGN PATENT DOCUMENTS 01012250  2/1978  Japan ........................................ 333/172

OTHER PUBLICATIONS

Grebene, Alan B. *Analog Integrated Circuit Design*, (Exar Integrated Systems, Inc. Sunnyvale, CA), Kindai Kagaku-sha, 1975, trans. by Nakazawa et al., pp. 94–99.

*Primary Examiner*—Timothy P. Callahan
*Assistant Examiner*—Dinh Le
*Attorney, Agent, or Firm*—Leydig, Voit & Mayer, Ltd.

[57] ABSTRACT

A filter circuit using junction capacitors of semiconductors of the present invention prevents the distortion of signal waveforms and is not affected by parasitic capacitors. The filter circuit includes a resistor whose first terminal is connected to an input terminal and whose second terminal is connected to an output terminal. A first junction capacitor is connected between a control voltage supply terminal and an output terminal and a second junction capacitor is connected between the output terminal and ground. An alternate embodiment of the filter circuit includes a pnp transistor, whose emitter is connected to the direct current power supply via a resistor, whose collector is grounded, and whose base is connected to the output terminal.

6 Claims, 24 Drawing Sheets

FILTER CIRCUIT USING A JUNCTION CAPACITOR OF A SEMICONDUCTOR

BACKGROUND OF THE INVENTION

1. Field of the Invention

The invention relates to a semiconductor integrated circuit, more specifically, relates to a filter circuit using a junction capacitor of a semiconductor.

2. Description of the Prior Art

A junction capacitor which makes use of a depletion layer of a p-n junction and a thin film capacitance which makes use of a thin film as a dielectric are two kinds of capacitances used in a filter circuit comprising a resistor and a capacitance in a semiconductor integrated circuit. The thin film capacitance requires a mask and a manufacturing process which are exclusively applied to the manufacturing of this thin film. On the other hand, the manufacturing of the junction capacitor is relatively cost-effective compared to that of the thin film, because the manufacturing process of an npn transistor which is generally applied to a semiconductor integrated circuit can be applied to the junction capacitor in the same manner. However, the junction capacitor is characterized in that the capacitance value changes depending on the voltage applied. Assuming the voltage applied to the junction capacitor is Vc, the capacitance value C is represented by the following equation (1);

$$C = K \left( \frac{1}{Vc} \right)^{\frac{1}{n}} \quad (1)$$

where, K is a proportional constant, which depends on an impurity density level around the junction, n varies within the range of 2<n<3, which depends on the shape of the impurity diffusion constituting the junction. For example, in case of a step junction, n equals 2, while in case of a linear gradient junction, n equals 3. In case of diffusion-shape such as a Gaussian shape or a complementary error function shape, the value of n varies between that of the step junction and that of the linear gradient junction as disclosed in the book, titled "Analog Integrated Circuit", by Alan B Grebene, translated by Shuji Nakazawa et al., published by Kindai Kagaku-sha.

FIG. 22 is a graph diagram which embodies the equation (1), where three examples in the cases of n=2.1, 2.5, and 2.9 are respectively plotted when Vc varies from 0 to 2. FIG. 22 shows the decreasing inclination of a capacitance varies when the value of n varies. As a whole, the value of the capacitance decreases when the voltage applied to the junction capacitor increases.

FIG. 19 is a circuit configuration showing an example of a conventional lowpass filter circuit using a junction capacitor. The configuration of FIG. 19 comprises an input terminal 1, an outputs terminal 2, a resistor 3, and a junction capacitor 7. In FIG. 19, the lowpass filter is realized by a series connection of the resistor 3 and the junction capacitor 7.

FIG. 20 is a circuit configuration showing that a conventional lowpass filter circuit using as a transistor a junction capacitor. In FIG. 21, the collector of an npn transistor 49 is connected to a direct current power supply, the base of the npn transistor 49 is grounded, and the emitter of the npn transistor 49 is connected to the output terminal 2. Since this transistor 49 is constructed so that the emitter electric potential is higher than the base potential, the base has a reverse bias, and no electric current flows in the transistor. In this state, a junction capacitor C is formed between the base and the emitter. In FIG. 20, explanation is omitted, on those elements which have the same reference numbers as those in FIG. 19, since they represent the same elements.

FIG. 21 shows a semiconductor structure where a lowpass filter is realized on an integrated circuit substrate. In FIG. 21, both a resistor 3 and a junction capacitor 7 are defined on a p type substrate. The junction capacitor 7 is defined between a p layer defined on an n layer on a P substrate and an n layer defined on the p layer. In other words, the junction capacitor 7 is defined in a region where a diode mark lies, which is shown by an arrow C in FIG. 21. On the other hand, as shown by an arrow R, the resistor 3 is defined in a region which is isolated from the junction capacitor 7 on the p layer which is defined on the n layer right above the P type substrate.

The input/output gain G of this lowpass filter with such a configuration is represented by an equation (2), where the value of the resistor 3 is R, the capacitance value of the junction capacitor 7 is C, and the frequency of an inputted signal is f;

$$G = \frac{1}{\sqrt{1 + (2\pi fCR)^2}} \quad (2)$$

Since the junction capacitor 7 is, in this case, a junction capacitor, the value of the capacitance C in the equation (2) varies depending on the applied voltage, according to the equation (1). Accordingly, the input/output gain G varies as the value of the capacitance C varies.

Accordingly, when an alternating current signal is inputted into the lowpass filter of FIG. 19, the input/output gain changes depending on the electric potential of the signal. As a result, the waveform of an output signal is distorted, as shown in FIG. 23. The waveform shown with the solid line in FIG. 23 represents a signal which is outputted from the output terminal 2 when a sine wave is applied to the input terminal 1 of the lowpass filter circuit shown in FIG. 19. The waveform shown with the dotted line represents an ideal sine wave output which is outputted from the output terminal 2 when the sine wave is applied to the input terminal 1 of the ideal lowpass filter. The capacitance value of the junction capacitor 7 in the lowpass filter of FIG. 19 varies depending on the value of the applied voltage as mentioned above. For example, the capacitance value increases at the moment when the voltage of the inputted signal decreases, and decreases at the moment when the voltage of the inputted signal increases.

As understood from the equation (2), the input/output gain G decreases as the capacitance value of the junction capacitor 7 increases at the point where the voltage of the inputted signal is low, while the input/output gain G increases as the capacitance value of the junction capacitor 7 decreases at the point where the voltage of the inputted signal is high. Shown in FIG. 23, a gap is left between the sine waveform of the output signal and that of the ideal signal in the bottom side. This phenomenon is prevented either by suppressing the amplitude of the signal inputted to the filter circuit, or by raising the DC level of the inputted signal so that the voltage applied to the junction capacitor 7 becomes high.

However, if the amplitude of the inputted signal is suppressed, this may deteriorate the signal-to-noise (S/N) ratio. The voltage applied to the junction capacitor 7 is not raised limitlessly in relation to the power supply voltage used in the integrated circuit. Moreover, the leakage current at the reverse bias of the p-n junction increases if the voltage applied to the junction capacitor 7 is raised.

Accordingly, although using a junction capacitor as a capacitance of a filter circuit has advantages over the use of a thin film capacitance in terms of cost-effective manufacturing, however it has an inevitable defect that the output signal waveform is distorted.

SUMMARY OF THE INVENTION

It is an object of the invention to provide a filter circuit in which a distortion of the waveform is prevented as much as possible, even if a junction capacitor is used.

According to one aspect of the invention, a lowpass filter circuit comprises resistor whose one terminal is connected to an input terminal and whose other terminal is connected to an output terminal; a first junction capacitor which is connected between a control voltage supply terminal and an output terminal; and a second junction capacitor which is connected between the output terminal and a ground.

According to another aspect of the invention, a highpass filter circuit comprises a first junction capacitor whose one terminal is connected to an input terminal and whose other terminal is connected to an output terminal; a level shift circuit whose input termial is connected to the input terminal; a second junction capacitor whose one terminal is connected to an output terminal of the level shift circuit and whose other terminal is connected to the output terminal; and a serial circuit, consisted of a resistor and a constant voltage supply, which is connected between the output terminal and a ground.

According to other aspect of the invention, the first junction capacitor of the lowpass filter circuit is formed by an npn transistor, a collector of the npn transistor is connected to the direct current power supply, an emitter of the npn transistor is connected to a terminal of the control voltage supply, and a base of the npn transistor is connected to the output terminal; and the second junction capacitor of the lowpass filter circuit is formed by an npn transistor, a collector of the npn transistor is connected to a direct current power supply, a base of the npn transistor is grounded, and an emitter of the npn transistor is connected to the output terminal.

According to further aspect of the invention, the first junction capacitor of the highpass filter circuit is formed of an npn transistor, a collector of the npn transistor is connected to the direct current power supply, an emitter of the npn transistor is connected to the input terminal, and a base of the npn transistor is connected to the output terminal; and the second junction capacitor of the highpass filter circuit is formed of an npn transistor, a collector of the npn transistor is connected to the direct current power supply, a base of the npn transistor is connected to the level shift circuit, and an emitter of the npn transistor is connected to the output terminal.

Preferably, the lowpass filter circuit further comprises a pnp transistor, an emitter of the pnp transistor is connected to the direct current power supply via a resistor; a collector of the pnp transistor is grounded; and a base of the pnp transistor is connected to the output terminal.

Preferably, the highpass filter circuit further comprises a pnp transistor, an emitter of the pnp transistor is connected to the direct current power supply via a resistor; a collector of the pnp transistor is grounded; and a base of the pnp transistor is connected to the output terminal.

According to still further aspect of the invention, the level shift circuit of the highpass filter comprises an input terminal connected to a base of an npn transistor; collector of the transistor is connected to the direct current power supply; an emitter of the transistor is connected to an anode input of a serial connection consisted of one or more diodes; and a cathode output of the serially connected diode is grounded via a constant current supply, as well as connected to an output terminal of the level shift circuit.

DETAILED DESCRIPTION OF THE PREFERRED EMBODIMENTS

Embodiment 1.

Figure 1:
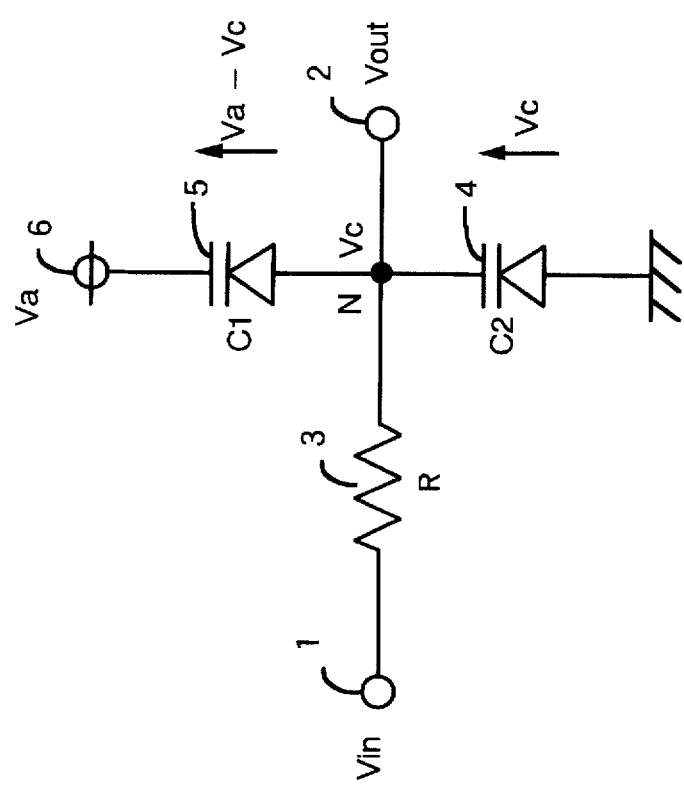
FIG. 1 is a circuit configuration of a lowpass filter according to a first embodiment of the invention.
Figure 19:
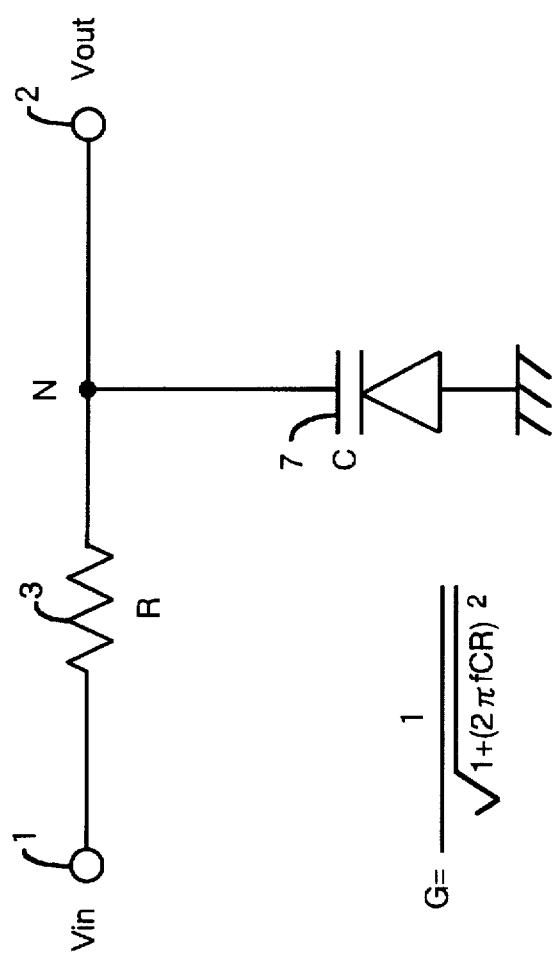
FIG. 19 is a circuit configuration of a conventional lowpass filter circuit using a junction capacitor.
Figure 20:
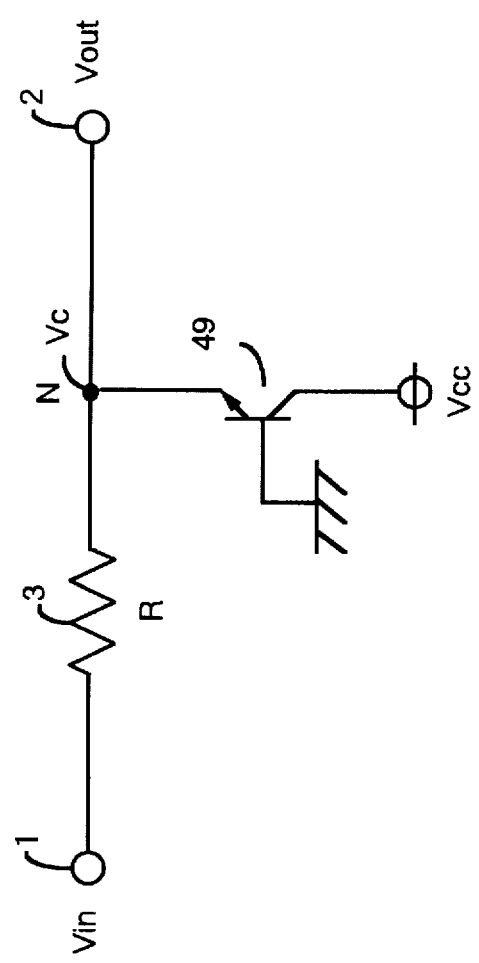
FIG. 20 is a circuit configuration of a conventional lowpass filter circuit constructed using a transistor.
Figure 21:
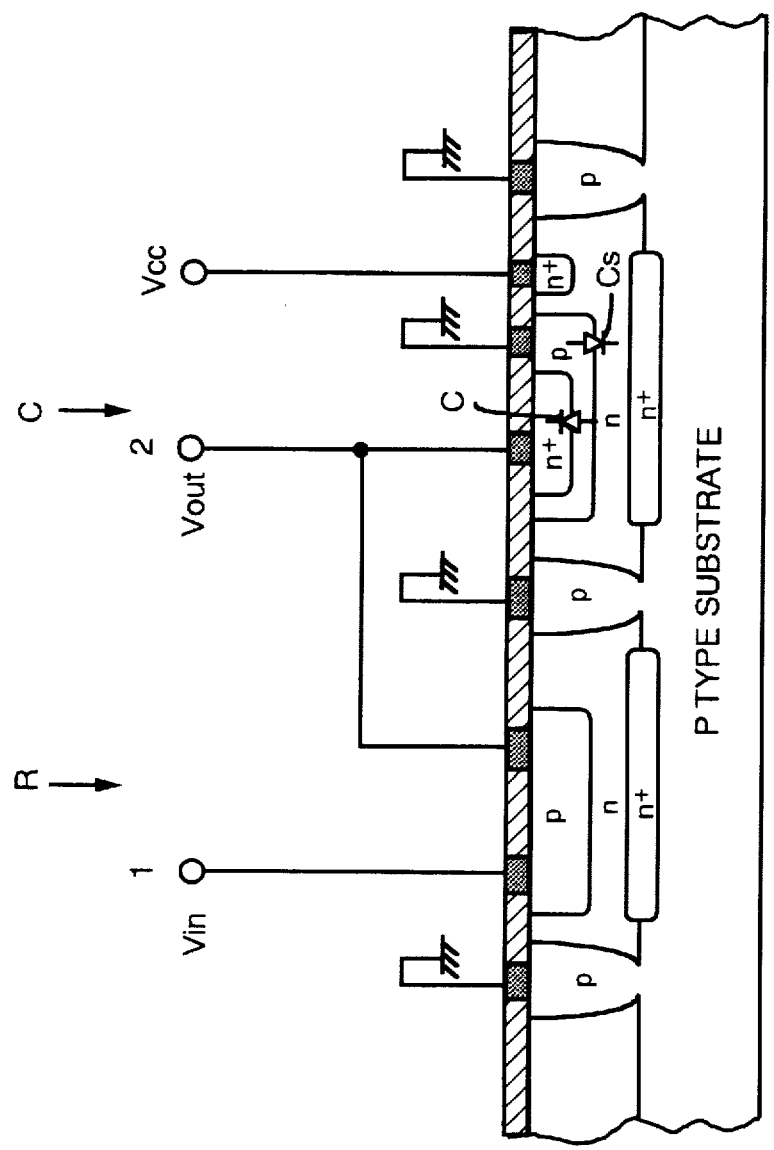
FIG. 21 shows a semiconductor structure where a conventional lowpass filter is realized on an integrated circuit substrate.

FIG. 1 is a circuit configuration of a lowpass filter according to a first embodiment of the invention. The configuration of FIG. 1 comprises an input terminal 1, an output terminal 2, a resistor 3, junction capacitors 4, 5 of a semiconductor, and a control voltage supply 6. According to the first embodiment of the invention, two capacitance, each of which has half of the conventional value of the capacitance C, are connected in the output side of the resistor 3. A lowpass filter which is not affected by the variation of the inputted voltage is realized in such connection. Assuming that the area for the respective junction capacitors 4, 5 on the semiconductor substrate is half of that of the junction capacitor 7 of FIG. 19 in order to compare the invention with the prior art. In other words, if the same voltage is applied respectively to the junction capacitors 4, 5 in FIG. 1 and to the junction capacitor 7 in FIG. 19, the respective values of the junction capacitors 4, 5 are half of that of the junction capacitor 7.

Figure 2:
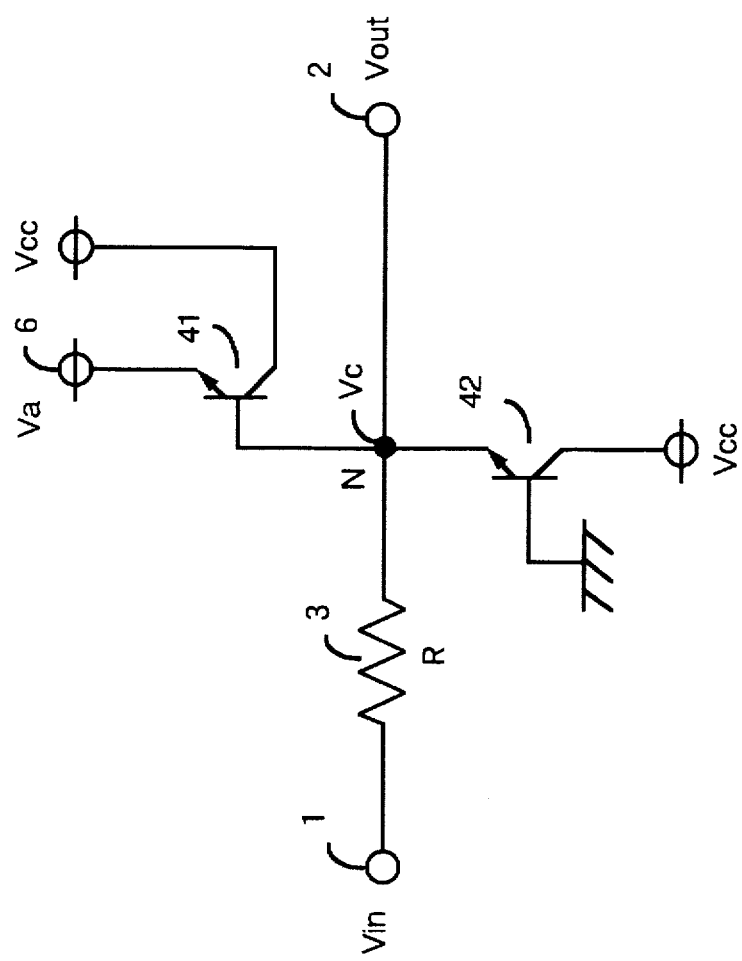
FIG. 2 is a circuit configuration of a lowpass filter constructed using a transistor according to the first embodiment of the invention.

FIG. 2 is a circuit configuration of a lowpass filter constructed using a transistor according to the first embodiment of the invention. In FIG. 2, the collector of a second npn transistor 42 is connected to a direct current power supply Vcc, its base is grounded, and its emitter is connected to the output terminal 2. The emitter of a first npn transistor 41 is connected to the control voltage supply 6, its collector is connected to the direct current power supply Vcc, its base is connected to the output terminal 2. Since these transistors 41, 42 are so constructed that the electric potential of the respective emitters is higher than that of the respective bases, no current flows through the transistors because the reverse bias potential is applied to the respective bases. In this state, junction capacitors C1, C2 are formed, respectively, between the respective bases and the emitters of the transistors 41, 42. Explanation is omitted, in FIG. 2, on those elements which have the same reference numbers as those in FIG. 1, since they represent the same elements.

Figure 3:
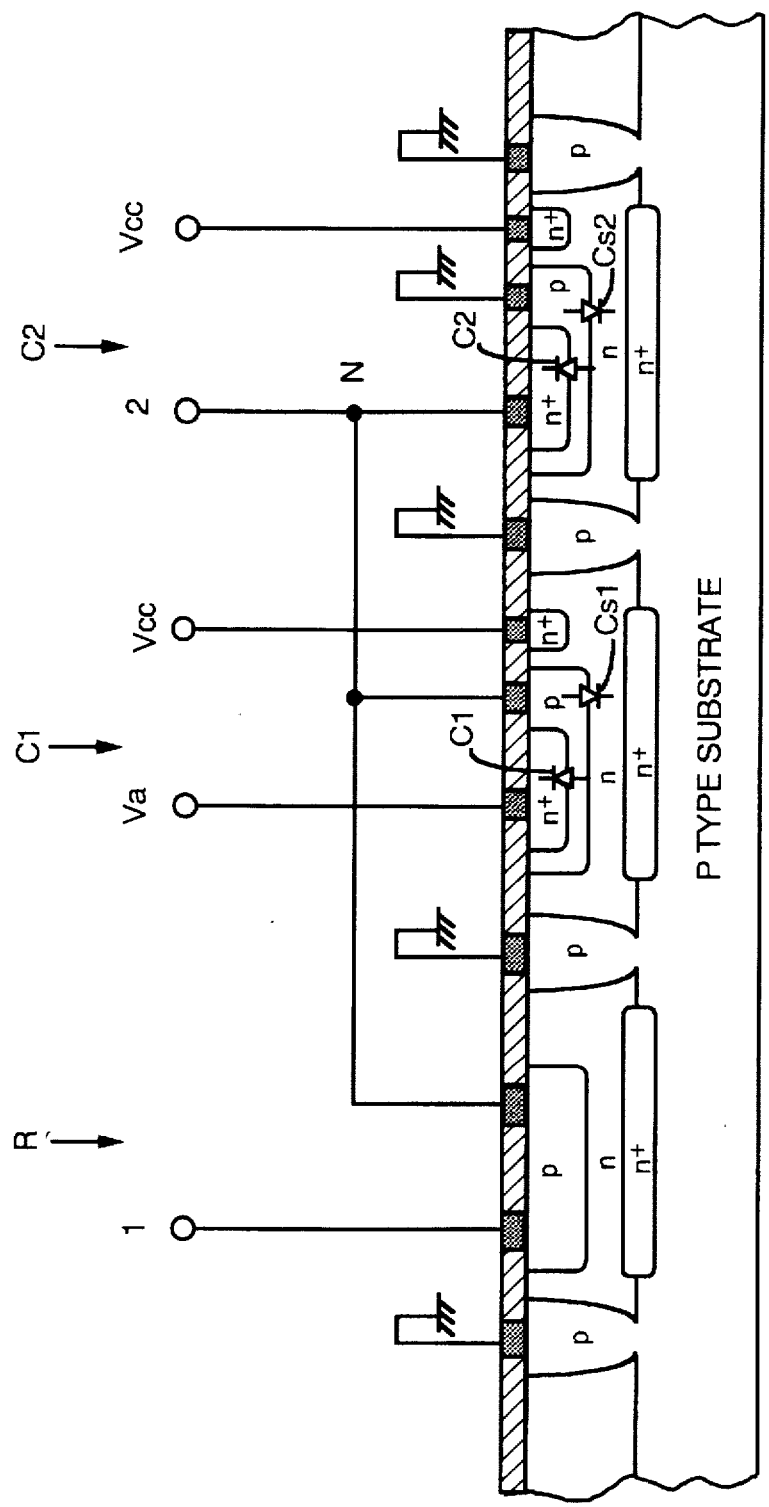
FIG. 3 shows a semiconductor structure where a lowpass filter is realized on an integrated circuit substrate according to the first embodiment of the invention.

FIG. 3 shows a semiconductor structure where a lowpass filter is realized on an integrated circuit substrate according to the first embodiment of the invention. The junction capacitor 4 is defined between a p layer defined on an n layer right above a P type substrate and an n layer defined on the p layer. In other words, the junction capacitor 4 is defined at a place where a diode mark C2 lies in FIG. 3. The junction capacitor 5 is defined on the other part between the p layer defined on the n layer right above the P type substrate and the n layer defined on the p layer. In other words, the junction capacitor 5 is defined at a place where a diode mark C1 lies in FIG. 3. On the other hand, as shown by an arrow R, the resistor 3 is defined in a region where is isolated from the junction capacitors 4, 5 on the p layer which is defined on the n layer right above the P type substrate.

In addition to the above, a parasitic capacitor Cs2 is formed between the n layer right above the P type substrate and the p layer defined on the n layer around the portion of C2. A parasitic capacitor Cs1 is formed between the n layer right above the P type substrate and the p layer defined on the n layer around the portion of C1. Further explanation on these parasitic capacitors Cs1, Cs2 is omitted in this embodiment, since they are explained in detail in the third embodiment.

The operation of a lowpass filter according to the first embodiment is explained below. The circuit shown in FIG. 1 is a lowpass filter comprising the input terminal 1 and the output terminal 2. The capacitance as a constituent part of the filter is a compound capacitor comprising of the junction capacitors 4 and 5, which are connected in parallel. The value of the compound capacitance in this circuit is the sum of the respective values of these junction capacitors 4 and 5, which is represented by the equation (3), assuming that the voltage value of the control voltage supply 6 is Va and voltage applied to the junction capacitor 4 is Vc;

$$C = \frac{1}{2} \left\{ K1 \left( \frac{1}{Vc} \right)^{\frac{1}{n}} + K2 \left( \frac{1}{Va - Vc} \right)^{\frac{1}{n}} \right\} \quad (3)$$

where, K1 and K2 are, proportional constants respectively, and n varies within the range of 2<n<3.

Figure 4:
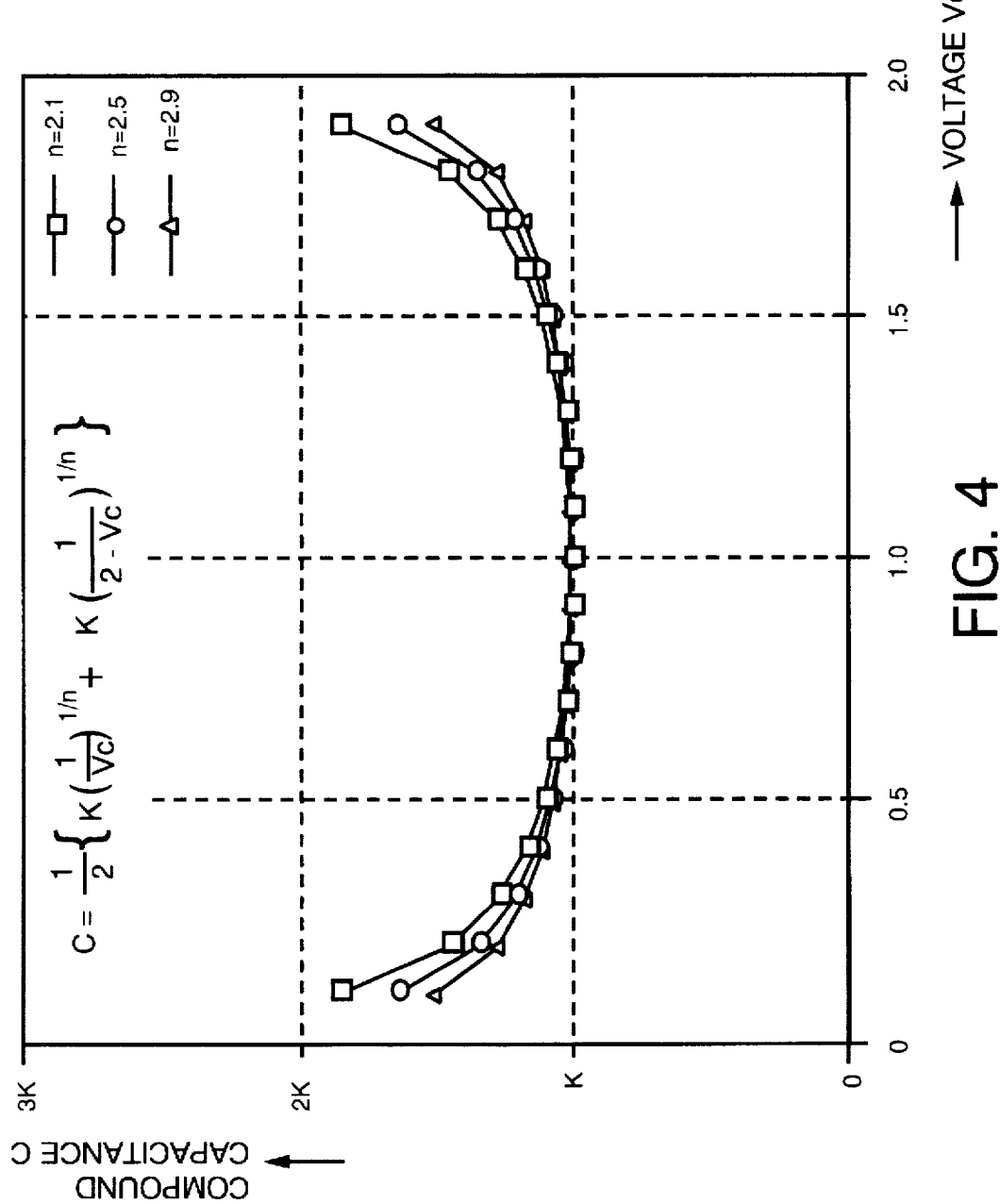
FIG. 4 shows variation of a compound capacitance value according to the first embodiment of the invention.

FIG. 4 is a simulation graph which embodies the equation (3) in case of K1, K2=K. In FIG. 4, three examples in case of n=2.1, 2.5, and 2.9 are respectively plotted when the applied voltage Va equals to 2 [V] and Vc varies from 0 [V] to 2 [V], for the sake of simplification of the explanation. FIG. 4 shows that the variation of the compound capacitance C is significantly small where the value of the voltage Vc which is applied to the junction capacitor 4 is close to 1 [V]. This is because the sum of the value of the capacitor 4 and capacitor 5 cancels the variation of the respective capacitance to each other, since the voltage applied to the junction capacitor 5 decreases when the voltage applied to the junction capacitor 4 increases, and the voltage applied to the junction capacitor 5 increases when the voltage applied to the junction capacitor 4.

Figure 5:
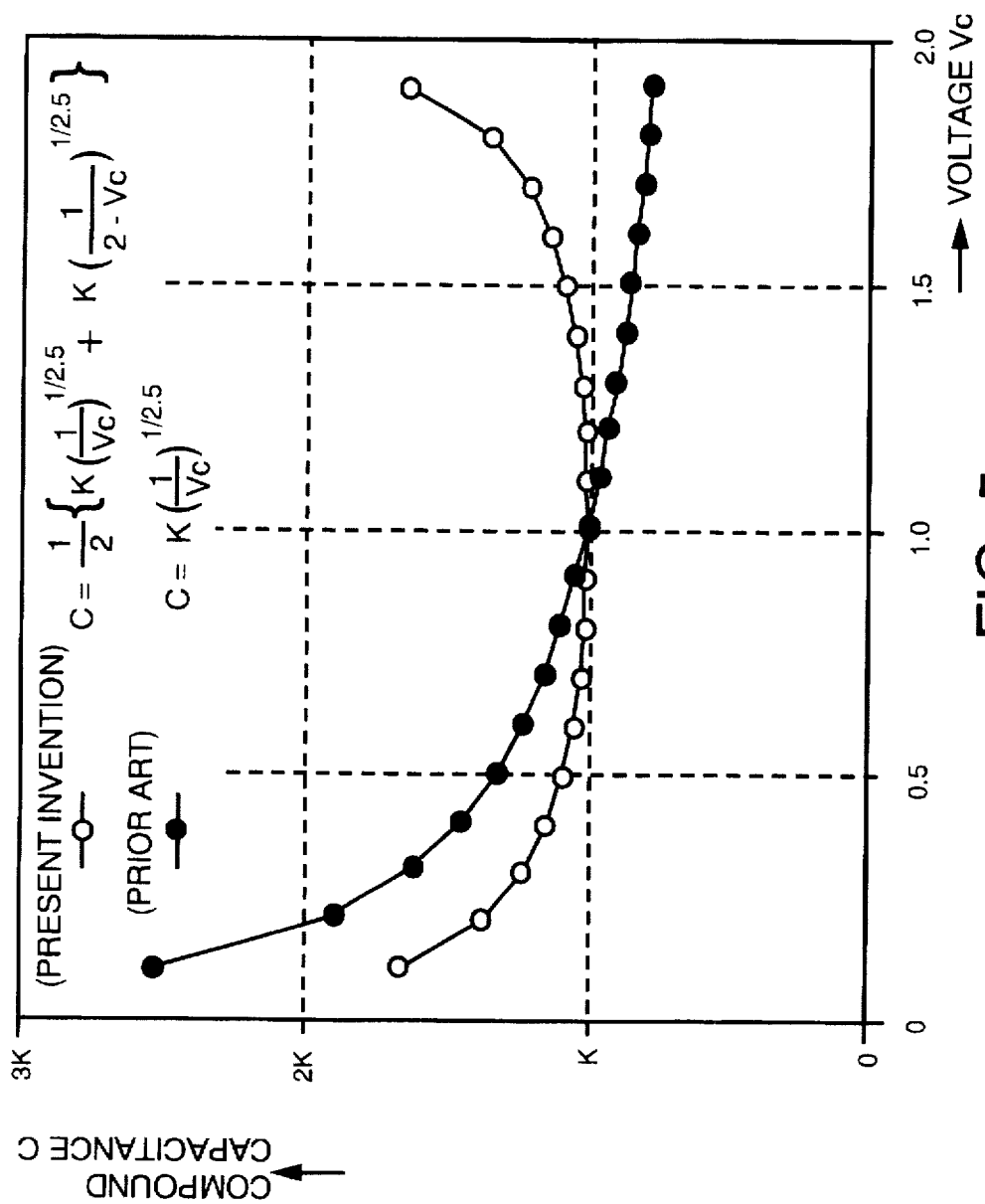
FIG. 5 shows comparison of the compound capacitance value between the first embodiment of the invention and the prior art.
Figure 22:
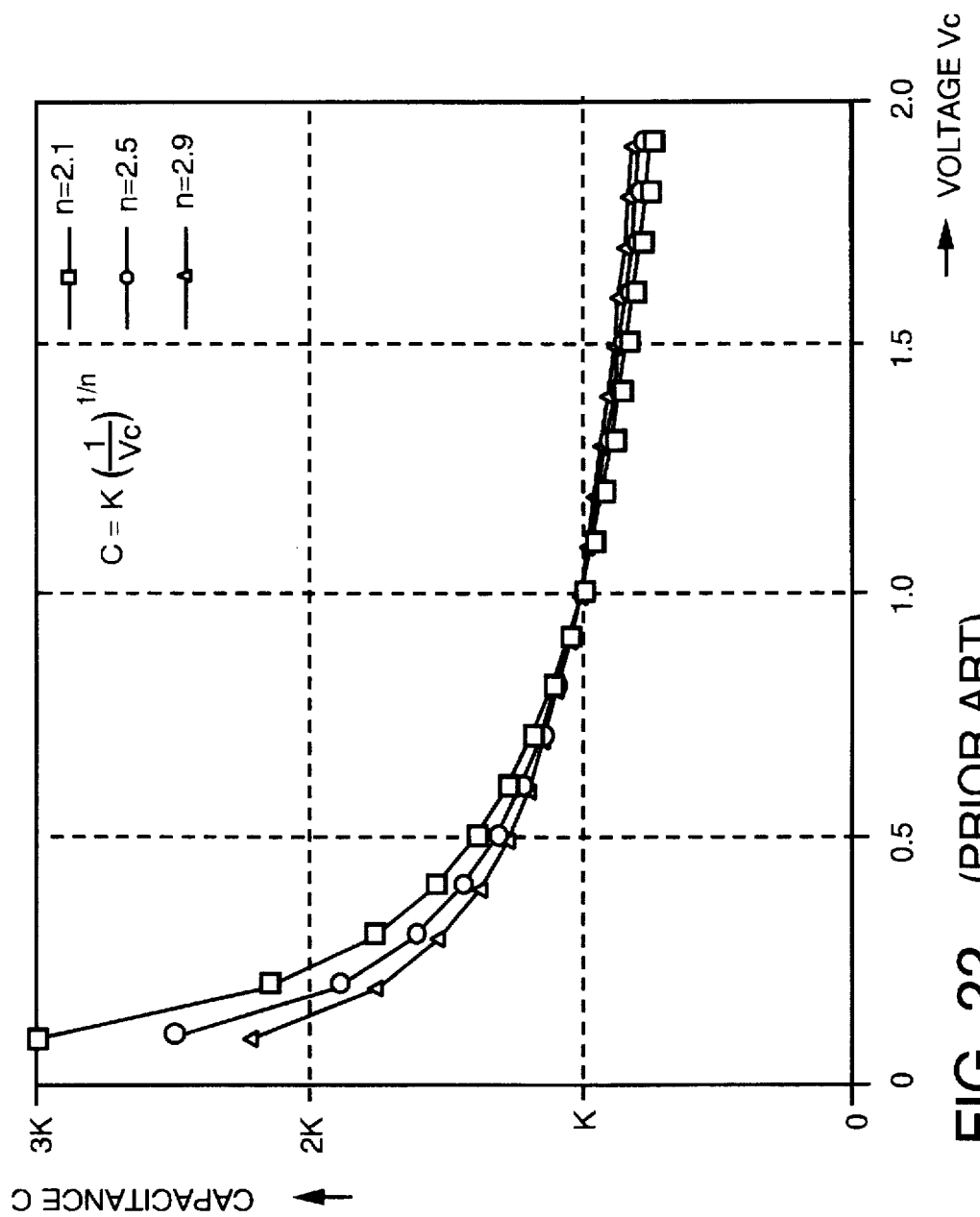
FIG. 22 shows how the value of junction capacitor changes depending on applied voltage.
Figure 23:
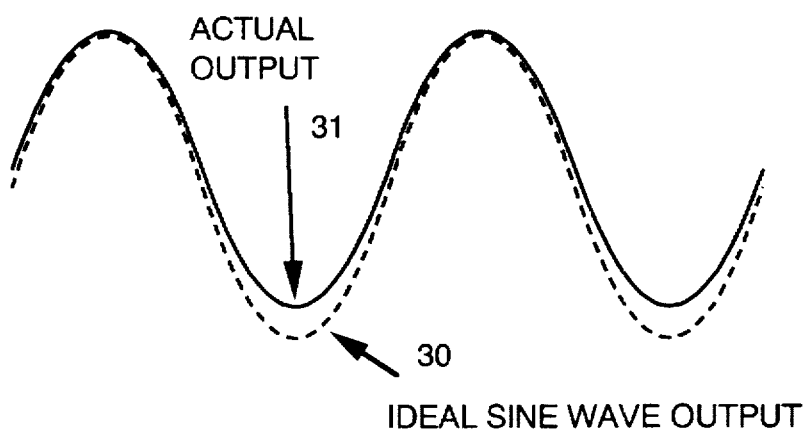
FIG. 23 shows how waveform is distorted in a conventional filter circuit using a junction capacitor.
Figure 24:
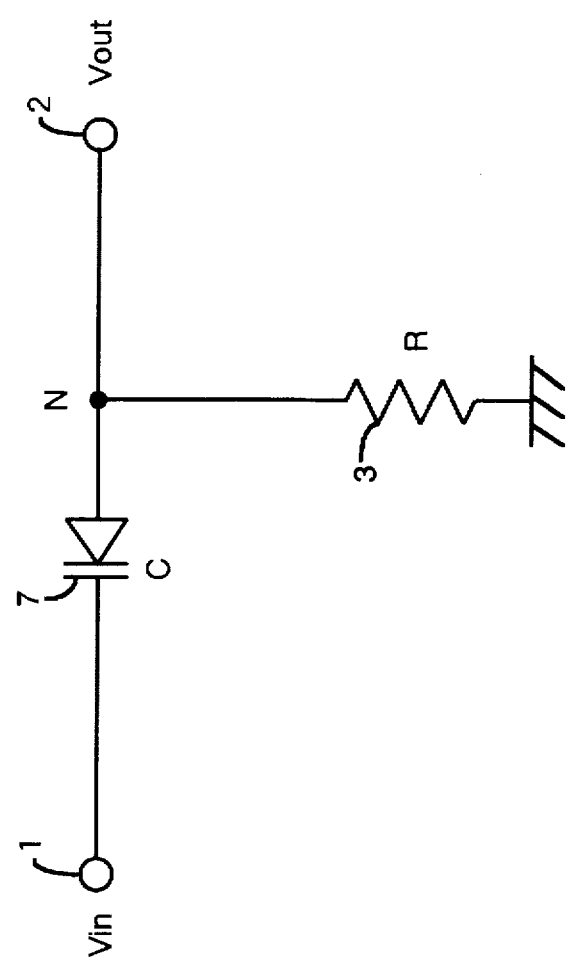
FIG. 24 is a circuit configuration of a conventional highpass filter circuit using a junction capacitor.

FIG. 5 is a diagram in the case of n=2.5, and K1=K2=K in respective FIG. 4 and FIG. 22 are superposed in order to compare the invention with the prior art. FIG. 5 shows that the variation of the capacitance value C in the filter circuit of the present invention is lower than that in the filter circuit of the prior art in the region where the value of the voltage Vc is close to 1. Since the input/output gain G in the filter circuit of FIG. 1 is represented by the same equation (2) as the prior art, the distortion of the waveform is lessened due to the decrease in the variation of the capacitance value C in the filter circuit of the present invention.

On the other hand, the variation of the capacitance value C increases where the value of Vc is close to either 0 or 2, in case of the present invention. However, a normal operation of the circuit cannot be expected when the signal which is inputted to the filter circuit of FIG. 1 exceeds the range between ground 0 [V] and the voltage of the control voltage supply 6. The operational margin is usually taken so that the electric potential of a signal does not come close to ground nor to the voltage of the control voltage supply 6. Therefore, the filter circuit is used within the range where the variation of the capacitance is small.

Embodiment 2.

Figure 6:
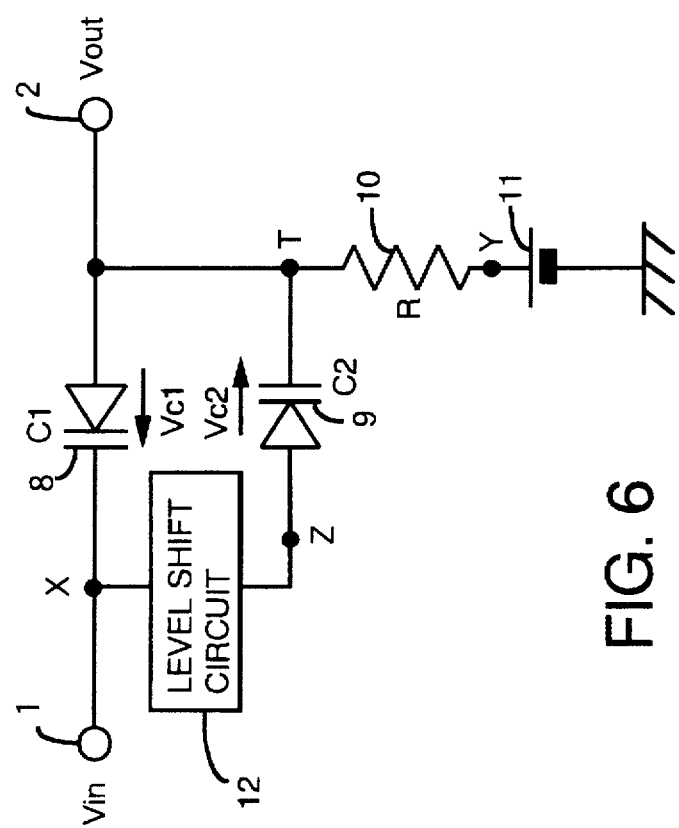
FIG. 6 is a circuit configuration of a highpass filter according to a second embodiment of the invention.

FIG. 6 shows an embodiment in which the present invention is applied to a highpass filter. The circuit construction of FIG. 6 comprises an input terminal 1, an output terminal 2, junction capacitors 8, 9, a resistor 10, a constant voltage supply 11, and a level shift circuit 12. The level shift circuit 12 operates so that the center level of the signal received from the input terminal 1 is shifted lower as much as a constant voltage without changing the amplitude of the inputted signal. The constant level should be shifted more than the level of the amplitude of the signal to be inputted. The value of the constant voltage supply 11 is set to the electric potential which is lowered by half of the level-shift quantity of the level shift circuit 12 from the level of the electric potential center of the signal inputted from the input terminal 1.

Figure 7:
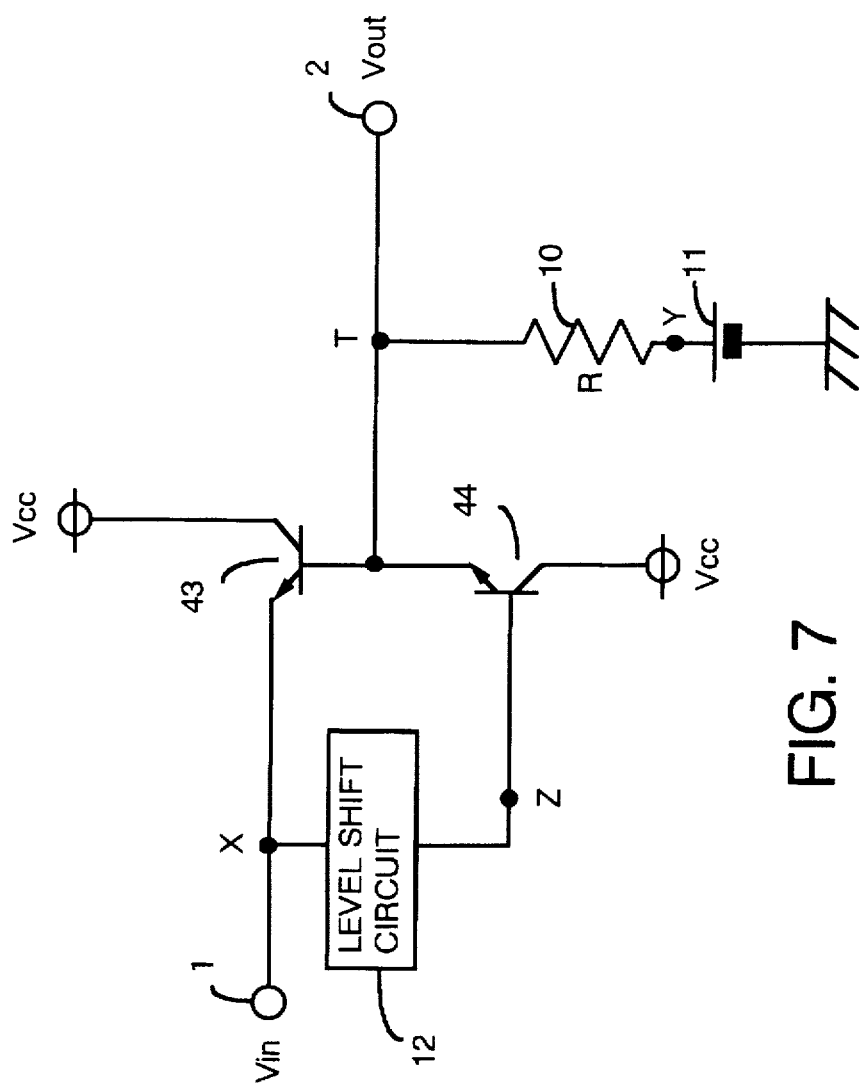
FIG. 7 is a circuit configuration of a highpass filter constructed using a transistor according to the second embodiment of the invention.

FIG. 7 is a circuit configuration of a highpass filter constructed using a transistor according to the second embodiment of the invention. In FIG. 7, the collector of a first npn transistor 43 is connected to a direct current power supply Vcc, its emitter is connected to the input terminal 1, and its base is connected to the output terminal 2. The collector of a second npn transistor 44 is connected to the direct current power supply Vcc, its base is connected to the level shift circuit, and its emitter is connected to the output terminal 2. Since these transistors 43, 44 are so constructed that the electric potential of the respective emitters is higher than that of the respective bases, no current flows through the transistors because the reverse biases are applied to the respective bases. In this state, junction capacitors C1, C2 are formed, respectively, between the respective bases and the emitters of the transistors 43, 44. Explanation is omitted, in FIG. 7, on those which have the same reference numbers as those in FIG. 6, since they represent the same elements.

Figure 8:
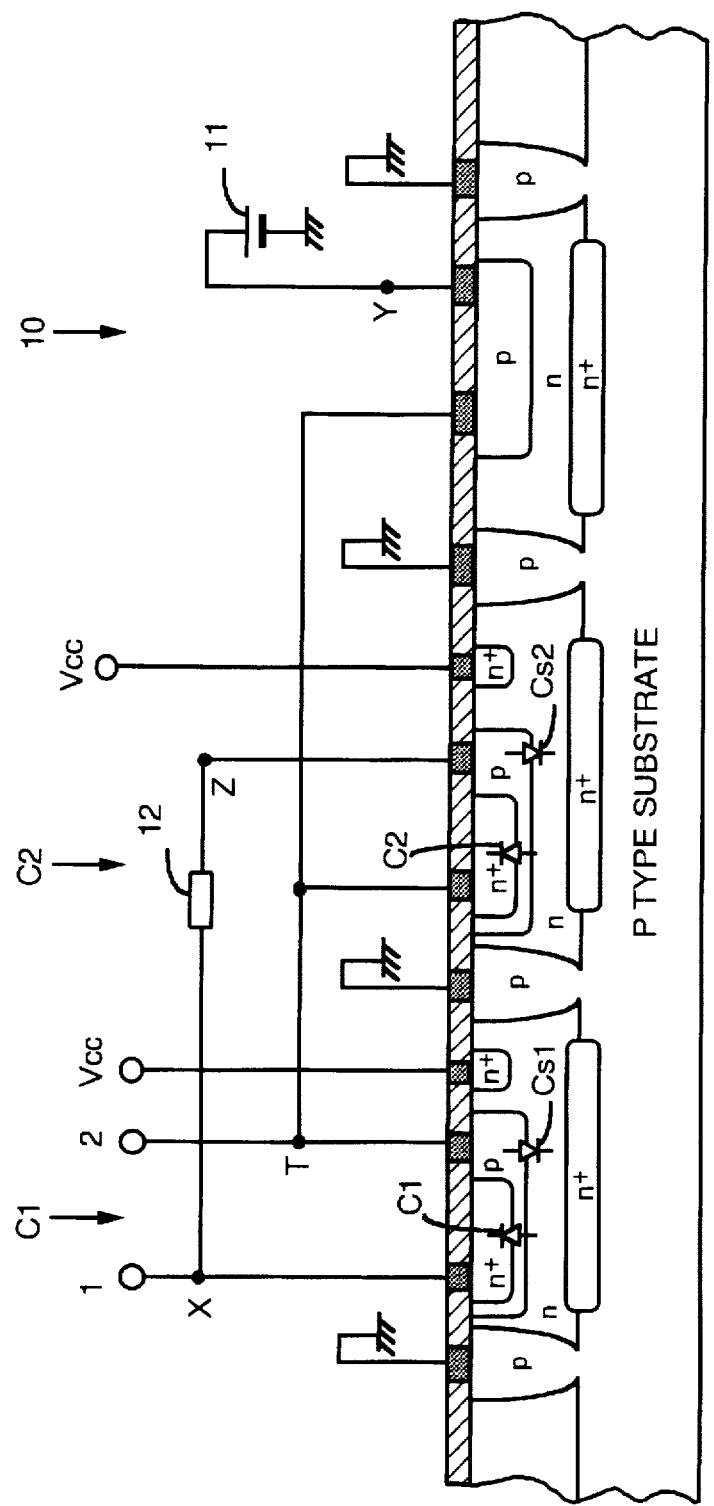
FIG. 8 shows a semiconductor structure where a highpass filter is realized on an integrated circuit substrate according to the second embodiment of the invention.

FIG. 8 shows a semiconductor structure where a highpass filter is realized on an integrated circuit substrate according to the second embodiment of the invention. The junction capacitor 8 is defined between a p layer defined on an n layer right above a P type substrate and an n layer defined on the p layer. In other words, the junction capacitor 8 is defined at a place where a diode mark C1 lies in FIG. 8. The junction capacitor 9 is defined on the other part between the p layer defined on the n layer right above the P type substrate and the n layer defined on the p layer. In other words, the junction capacitor 9 is defined at a place where a diode mark C2 lies in FIG. 8. On the other hand, as shown by an arrow R, the resistor 10 is defined on a region which is isolated from the junction capacitors 8, 9 on the p layer which is defined on the n layer right above the P type substrate. Although the level shift circuit 12 and the constant voltage supply 11 are illustrated in FIG. 8 as they are located in an outside circuit, they are merely illustrated from the convenience of explanation. They can of course be defined on the same P type substrate as the other elements.

In addition to the above, a parasitic capacitor Cs2 is formed between the n layer right above the P type substrate and the p layer defined on the n layer in the portion of C2. A parasitic capacitor Cs1 is formed between the n layer right above the P type substrate and the p layer defined on the n layer in the portion of C1. Further explanation on these parasitic capacitors Cs1, Cs2 is omitted in this embodiment, since they are explained in detail in the fourth embodiment.

Figure 9:
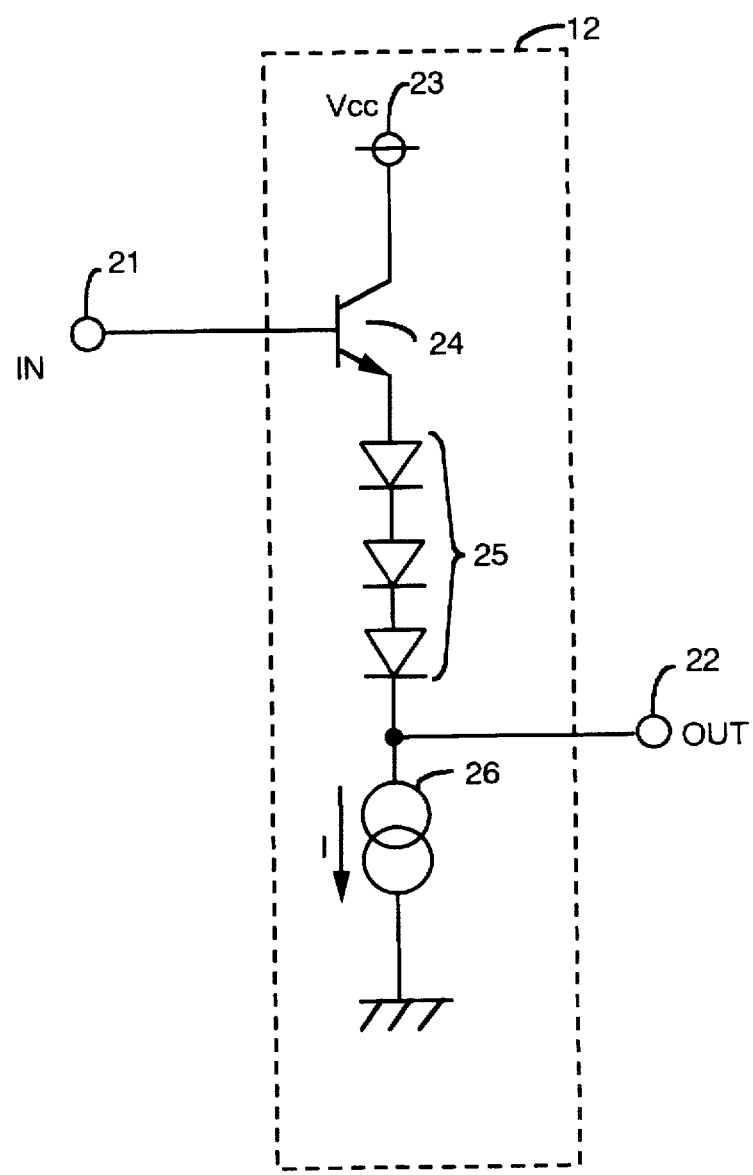
FIG. 9 is a diagram of the detailed configuration of the level shift circuit in FIG. 6.

FIG. 9 is a conventional circuit configuration of the level shift circuit 12 shown in FIG. 6. The circuit configuration shown in FIG. 9 is one example of the level shift circuit 12, although other circuit structural variations are possible. The configuration of FIG. 9 comprises an npn transistor 24, a plurality of diodes 25, a constant current supply 26, an input terminal 21, an output terminal 22, and a power supply 23. When a signal is inputted into the input terminal 21, the center electric potential of the input signal is shifted as much as the base-emitter voltage of the transistor 24 plus the voltage drop of the plurality of the diodes, and then signal is outputted to the output terminal 22. In this operation, only the center electric potential of the inputted signal is shifted, and the amplitude of the signal is kept to the same value as before when the signal is outputted to the output terminal 22.

Figure 10:
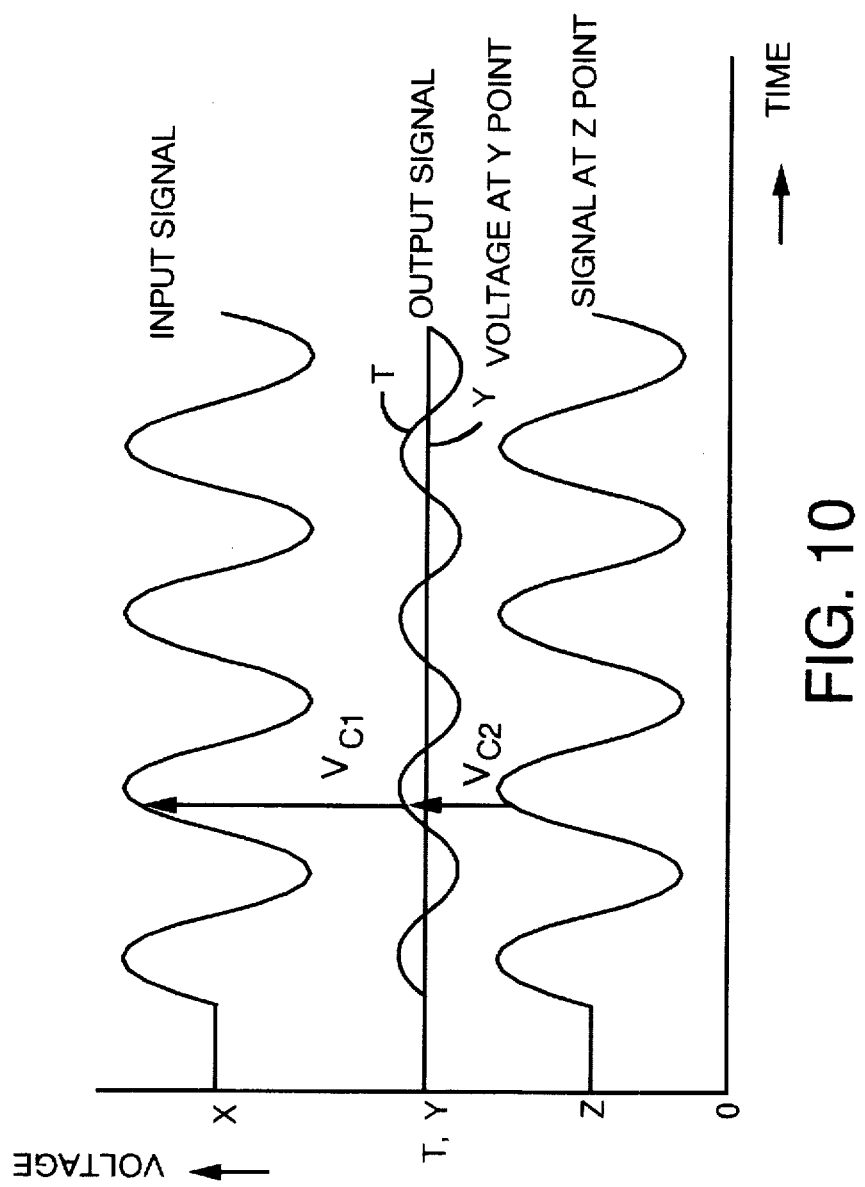
FIG. 10 shows voltages on the major points in the circuit of FIG. 6.

FIG. 10 shows the waveform relationship among the inputted signal on the X point, the signal on the Z point after it passed the level shift circuit 12, the electric potential on the Y point in the constant voltage supply 11 and the electric potential on the T point (output point), when a sine wave is inputted from the input terminal 1 of the highpass filter. The minimum magnitude level on the T point corresponds to the Y point. For example, if assuming the respective levels of the X, Y, and Z points are set as shown in FIG. 10, the level of the signal after the input signal has passed through the level shift circuit 12 descends so that its central value shifts from the level of the voltage on the X point to that on the Z point. This central electric potential on the Z point is lower than the electric potential on the Y point, and the electric potential at the maximum amplitude of the signal which flows on the Z point is set lower than the electric potential on the Y point as well as that on the T point. Since the impedance of the level shift circuit 12 is high in terms of direct current, while it is low in terms of alternating current, the X point and the Z point are shorted state in terms of alternating current, although the respective electric potentials on the X point and on the Z point are different in terms of direct current.

Accordingly, both the junction capacitors 8, 9 are supplied with the reverse bias, and the above relationship is maintained such that the voltage applied to the capacitor 9 decreases when the voltage applied to the capacitor 8 increases, while the voltage applied to the capacitor 9 increases when the voltage applied to the capacitor 8 decreases. Accordingly, the sum of the value of the capacitor 8 and that of the capacitor 9 cancels the respective variation of the capacitance value. The capacitance as a constituent part of the filter is a sum of the junction capacitors 8 and 9. The input/output gain G in this circuit is represented by the equation (4), if assuming the sum of the respective junction capacitors 8, 9 is C, the value of the resistor 10 is R, and the frequency of the inputted signal is f;

$$G = \frac{2\pi fCR}{\sqrt{1 + (2\pi fCR)^2}} \qquad (4)$$

According to the present invention, the variation of the input/output gain G can be prevented since the variation of the capacitance value C is suppressed according to the equation (4). As a result, the distortion of the waveform of the signal passed through the filter circuit is suppressed.

Embodiment 3.

Figure 11:
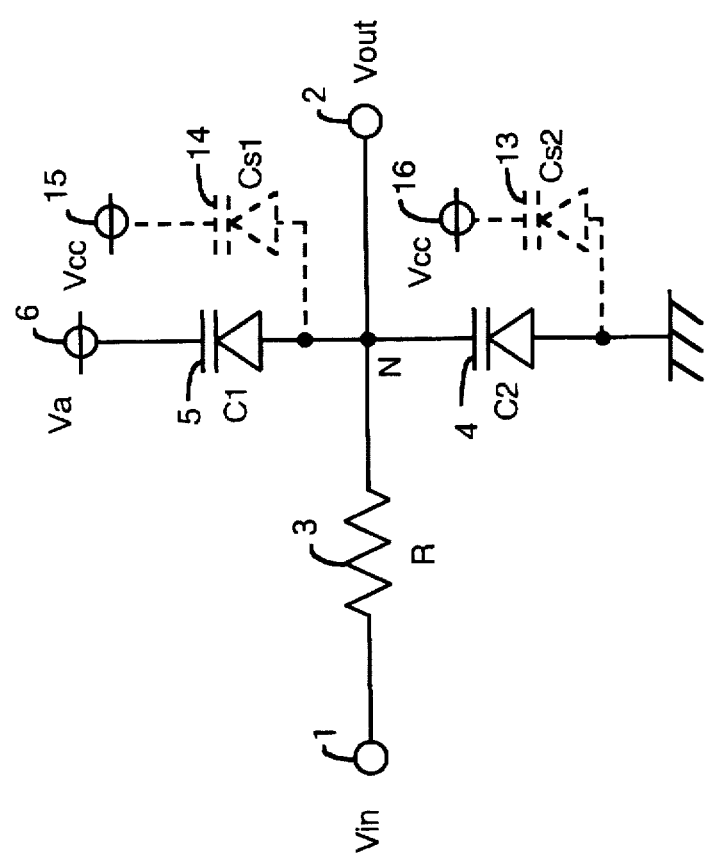
FIG. 11 is a diagram in which a parasitic capacitor formed by a junction capacitor is illustrated in addition to the circuit shown in FIG. 1.

FIG. 11 shows parasitic capacitors formed by junction capacitors between a collector and a base in the IC structure, respectively, in addition to the circuit shown in FIG. 1. The configuration of FIG. 11 comprises a collector-base parasitic capacitor (Cs2) 13 in addition to the junction capacitor 4, a collector-base parasitic capacitor (Cs1) 14 in addition to the junction capacitor 5, and power supplies Vcc 15, 16 of, for example, 5 [V].

As briefly mentioned in the first embodiment, the parasitic capacitor Cs2 is formed between the n layer right above the P type substrate and the p layer defined on the n layer in the portion around C2. The parasitic capacitor Cs1 is formed between the n layer right above the P type substrate and the p layer defined on the n layer in the portion around C1. In FIG. 11, the anode of the parasitic capacitor Cs1 is connected to the output terminal 2, and its cathode is connected to the power supply 15. The anode of the parasitic capacitor Cs2 is grounded, and its cathode is connected to the power supply 16. Accordingly, a desired characteristic of the filter circuit is not obtained because of this Cs1 which is actually added as a capacitance, even if the capacitance value C in the filter circuit is set to the sum of the C1 and C2. On the other hand, the (collector-base) parasitic capacitor Cs2 gives no effect on the characteristic of the filter circuit even if the electric potential on the N point changes, because the anode (p type diffusion side which constitutes the base region) of the parasitic capacitor Cs2 is grounded.

Figure 12:
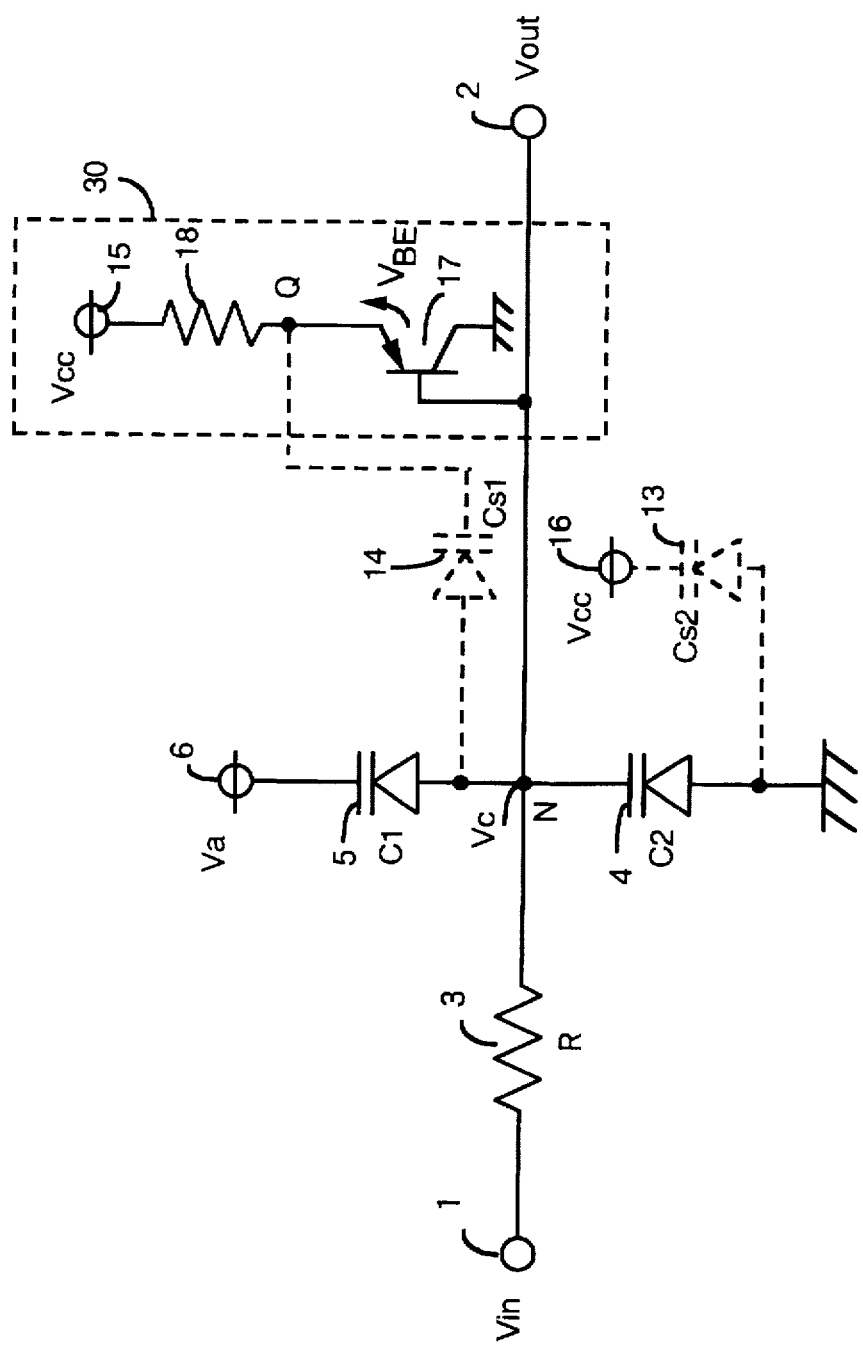
FIG. 12 is a circuit configuration of a lowpass filter according to a third embodiment of the invention.
Figure 13:
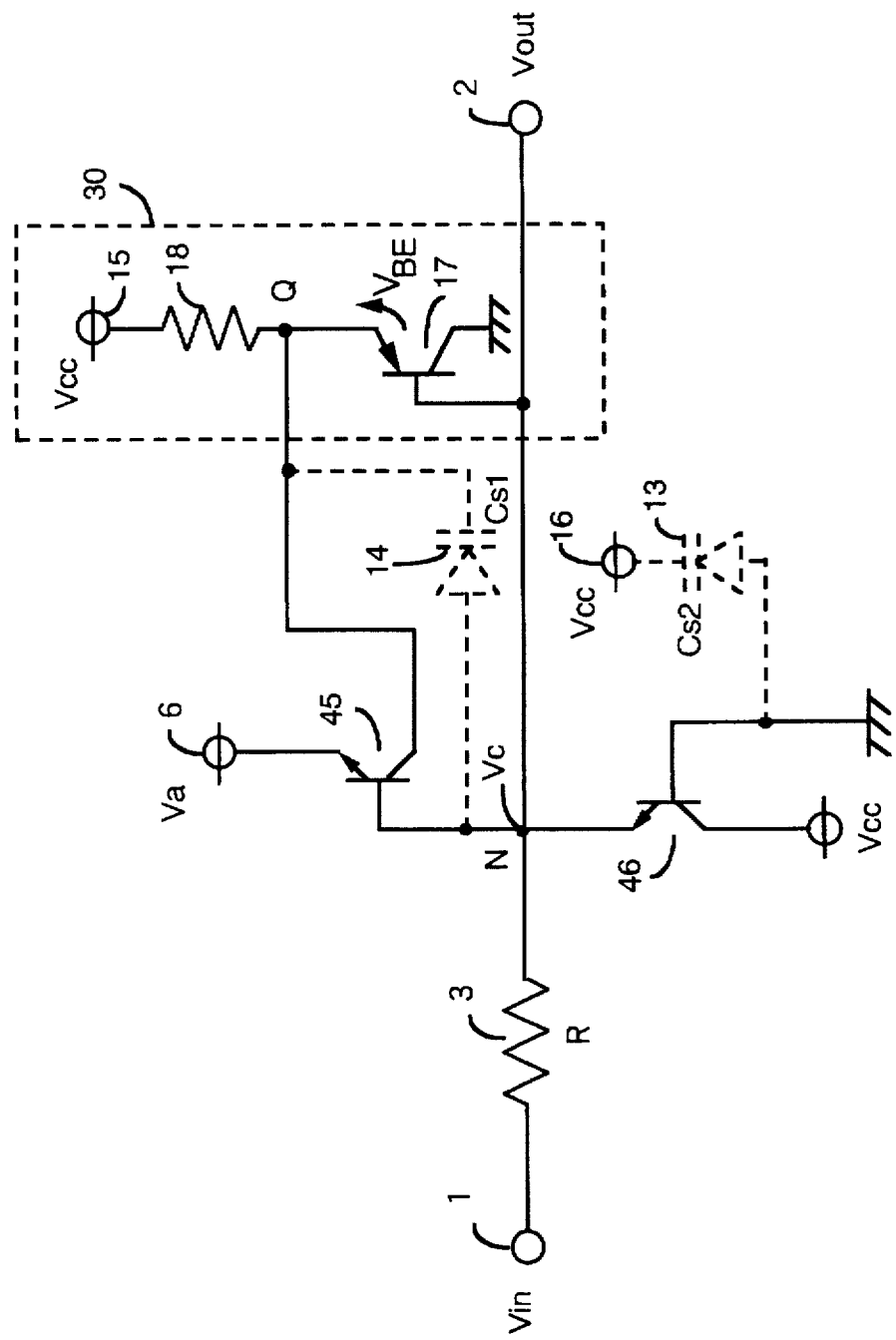
FIG. 13 is a circuit configuration of a lowpass filter constructed using a transistor according to the third embodiment of the invention.
Figure 14:
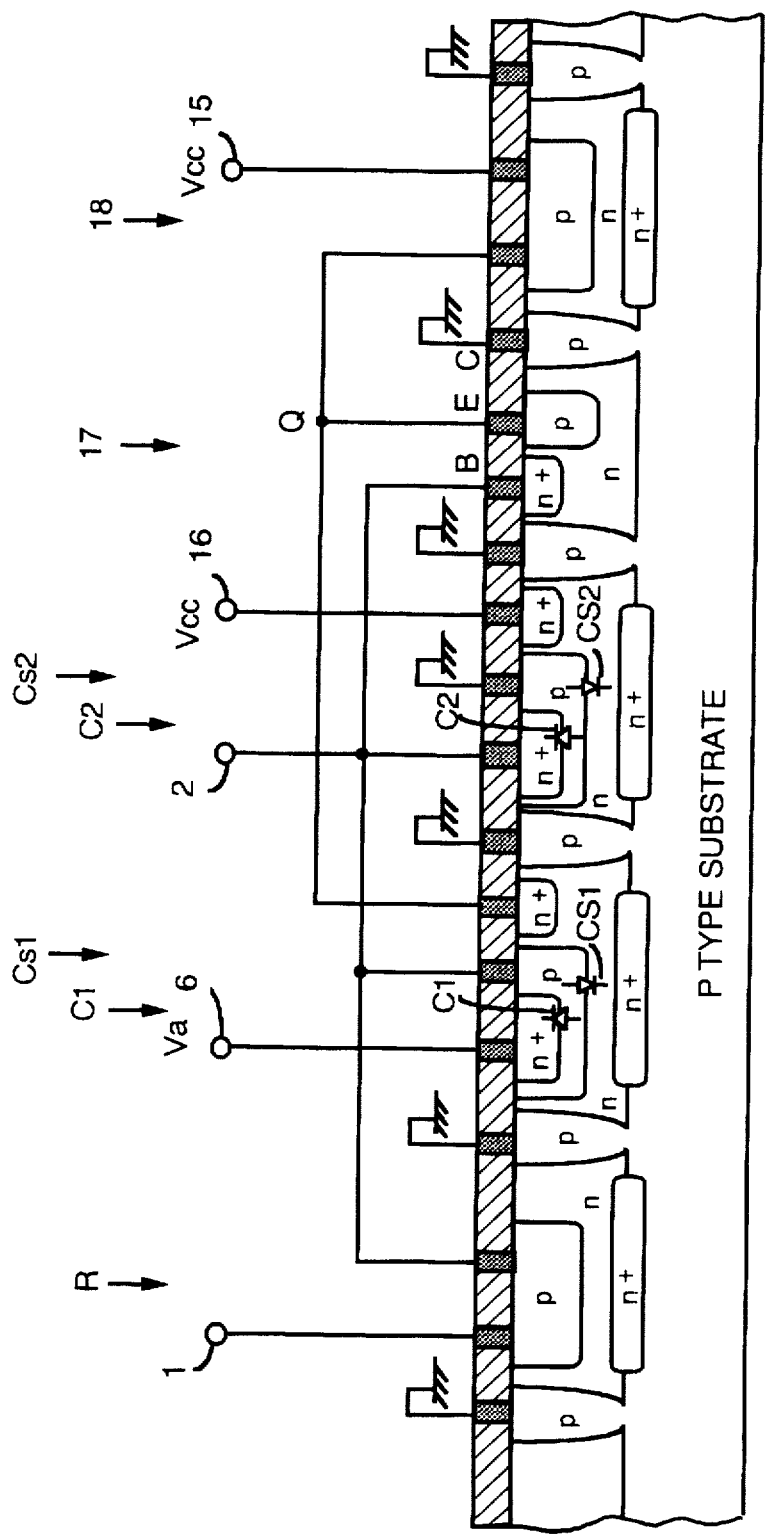
FIG. 14 shows a semiconductor structure where a lowpass filter is realized on an integrated circuit substrate according to the third embodiment of the invention.

FIG. 12 is a circuit configuration of a lowpass filter comprising a parasitic capacitor eliminating circuit according to the third embodiment of the present invention. FIG. 13 is a circuit configuration of a lowpass filter constructed using a transistor according to the third embodiment of the invention. FIG. 14 shows a semiconductor structure where a lowpass filter is realized on an integrated circuit substrate according to the third embodiment of the invention.

The configuration of FIG. 12 comprises a pnp transistor 17, and a resistor 18. The transistor 17 and the resistor 18 comprises an emitter-follower 30. The emitter of the transistor 17 in the emitter-follower 30 is connected to the power supply 15 via the resistor 18, the base of the transistor 17 which is an input of the emitter-follower 30 is connected to the output terminal 2, and the collector of the emitter-follower 17 is grounded In the configuration as mentioned above, the one terminal of the parasitic capacitor 14 is connected to the input of the emitter-follower, while the other terminal of it is connected to the output of the emitter-follower (the emitter of the transistor 17). On this account, the voltage on the respective terminals of the parasitic capacitor (Cs1) 14 is equal to the base-emitter voltage $V_{BE}$, which is always kept constant. Accordingly, the frequency characteristic of the lowpass filter circuit is not affected, because neither charge nor discharge occurs in the parasitic capacitor 14.

FIG. 13 is a circuit configuration of a lowpass filter constructed using a transistor according to the third embodiment of the invention. In FIG. 13, the emitter of a first npn transistor 45 is connected to the control voltage supply 6, its collector is connected to the emitter of the transistor 17, and its base is connected to the output terminal 2. On the other hand, the collector of a second npn transistor 46 is connected to the direct current power supply Vcc, its base is grounded, and its emitter is connected to the output terminal 2. Since these transistors 45, 46 are so constructed that the electric potential of the respective emitters is higher than that of the respective bases, no current flows through the transistors because the reverse bias is supplied with the respective bases. In this state, junction capacitors C1, C2 are formed, respectively, between the respective bases and the emitters of the transistors 45, 46. Explanation is omitted, in FIG. 13, on those which have the same reference numbers as those in FIG. 12, since they represent the same elements.

FIG. 14 shows a semiconductor structure where a lowpass filter is realized on an integrated circuit substrate according to the third embodiment. The junction capacitor (C2) 4 is defined between a p layer defined on an n layer right above a P type substrate and an n layer defined on the p layer. In other words, the junction capacitor (C2) 4 is defined at a place where a diode mark C2 lies in FIG. 14. The junction capacitor (C1) 5 is defined on the other part between the p layer defined on the n layer right above the P type substrate and the n layer defined on the p layer. In other words, the junction capacitor 5 is defined at a place where a diode mark C1 lies in FIG. 14. On the other hand, as shown by an arrow R, the resistor 3 is defined in a region which is isolated from the junction capacitors 4, 5 on the p layer which is defined on the n layer right above the P type substrate. On the other hand, the pnp transistor 17 is defined in another region which is isolated from the junction capacitors C1 and C2. In other words, the pnp transistor is defned among an isolation region defined on the P type substrate, an n epitaxial layer and a p layer which is defined on the n epitaxial layer. The collector of the pnp transistor is grounded, its emitter is connected to the power supply Vcc via a resistor which is defined in the other region, and its base is connected to the output terminal 2.

As mentioned above, the parasitic capacitor Cs2 is formed between the n layer right above the P type substrate and the p layer defined on the n layer in the portion of C2. The parasitic capacitor Cs1 is formed between the n layer right above the P type substrate and the p layer defined on the n layer in the portion of C1. The one terminal of the parasitic capacitor (Cs1) 14 is connected to the output terminal 2, while the other terminal of it is connected to the emitter of the transistor 17. On the other hand, the one terminal of the parasitic capacitor (Cs2) 13 is grounded and the other terminal of it is connected to the power supply 16.

Embodiment 4.

Figure 15:
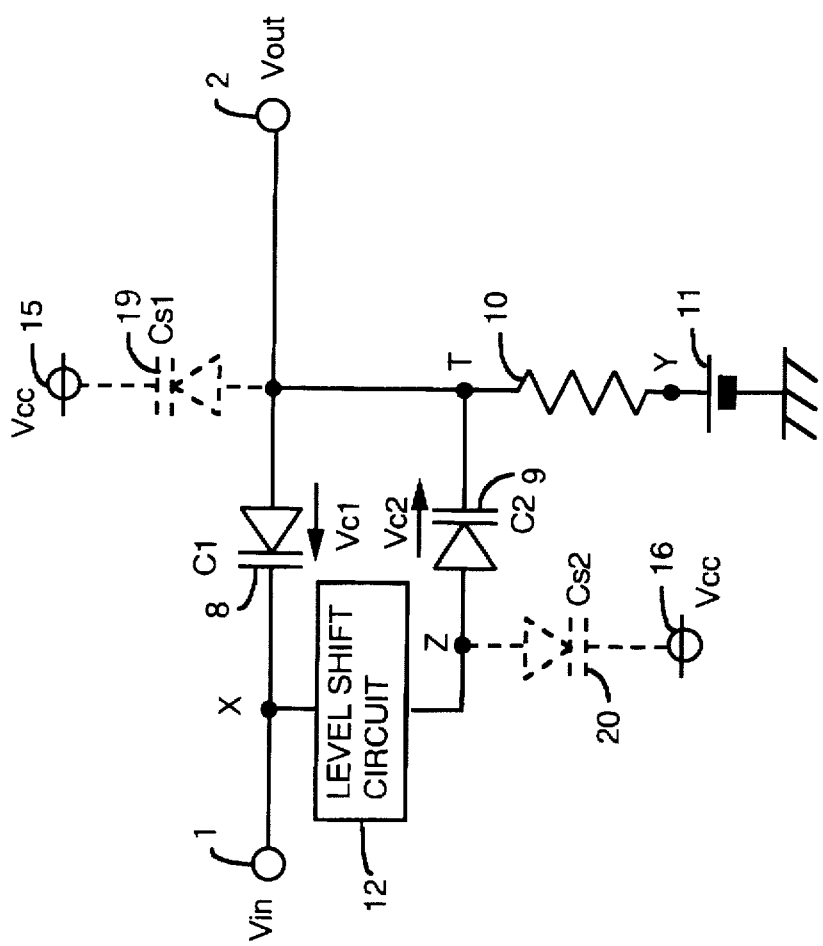
FIG. 15 is a diagram in which a parasitic capacitor formed by a junction capacitor is illustrated in addition to the circuit shown in FIG. 6.

FIG. 15 shows parasitic capacitors formed by junction capacitors between a collector and a base in the IC structure, respectively, in addition to the circuit shown in FIG. 6. The configuration of FIG. 15 comprises a collector-base parasitic capacitor (Cs1) 19 in addition to a junction capacitor (C1) 8, a collector-base parasitic capacitor (Cs2) 20 in addition to a junction capacitor (C2) 9, and power supplies Vcc 15, 16, for example, 5 [V].

As briefly mentioned in the second embodiment, the parasitic capacitor Cs2 is formed between the n layer right above the P type substrate and the p layer defined on the n layer in the portion of C2 (between the collector and the base). The parasitic capacitor Cs1 is formed between the n layer right above the P type substrate and the p layer defined on the n layer in the portion of C1 (between the collector and the base). In FIG. 15, the one terminal of the parasitic capacitor Cs1 is connected to the output terminal 2 (T point), and the other terminal is connected to the power supply 15. The one terminal of the parasitic capacitor Cs2 is connected to an output terminal of the level shift circuit 12 (Z point), and the other terminal is connected to the power supply 16. Accordingly, in terms of alternating current, the one terminal of this parasitic capacitor Cs1 is connected to the T terminal, and the other terminal of it is grounded.

Accordingly, a desired characteristic of the filter circuit is not obtained because of this Cs1 which is actually added as a capacitance, even if the capacitance value C in the filter circuit is set to the sum of the C1 and C2. On the other hand, the parasitic capacitor Cs2 gives less effect on the characteristic of the filter circuit even if the electric potential changes, because the impedance is usually significantly small at the Z point of the output of the level shift circuit 12 to which the anode of the parasitic capacitor Cs2 is connected.

Figure 16:
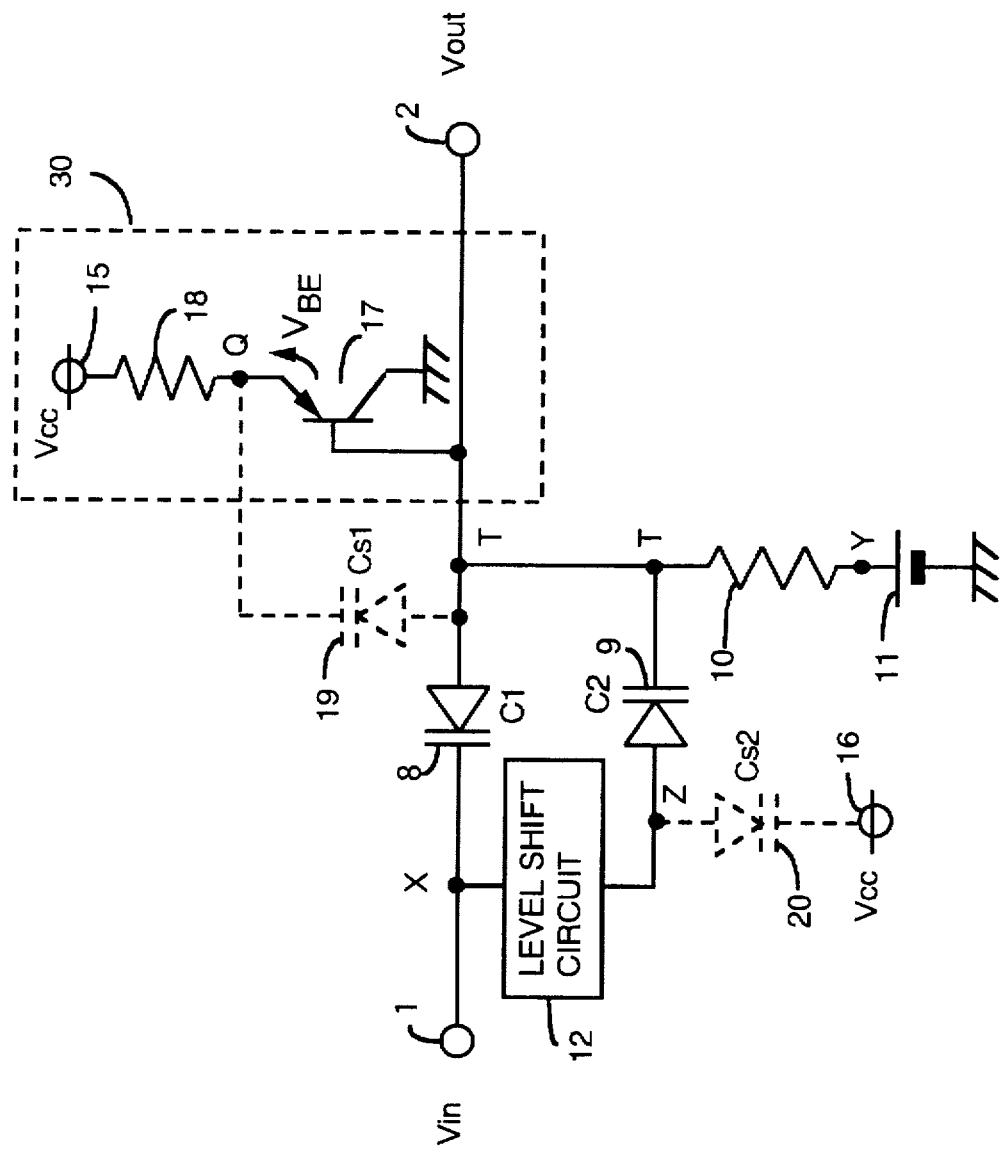
FIG. 16 is a circuit configuration of a highpass filter according to a fourth embodiment of the invention.
Figure 17:
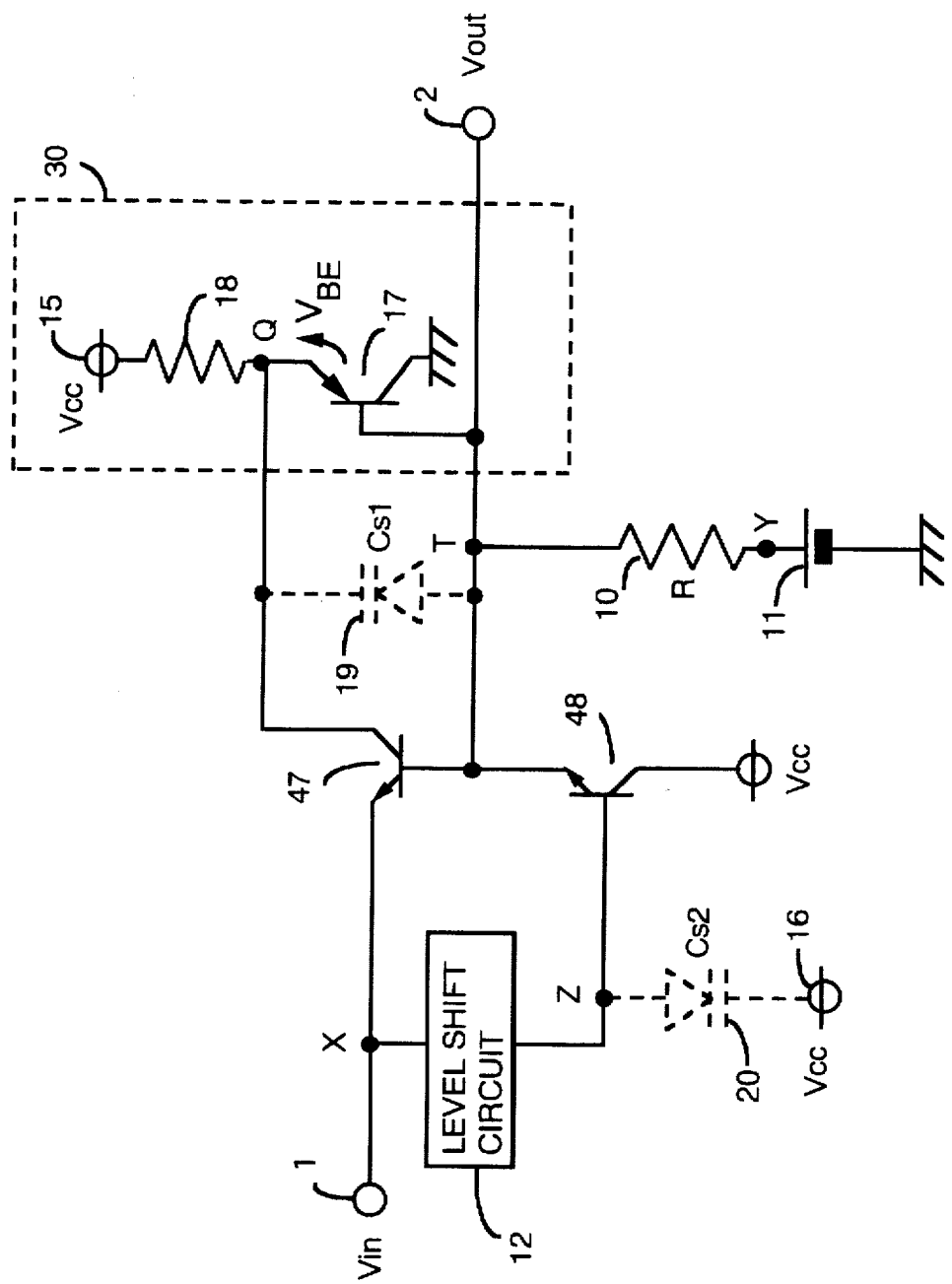
FIG. 17 is a circuit configuration of a highpass filter constructed using a transistor according to the fourth embodiment of the invention.
Figure 18:
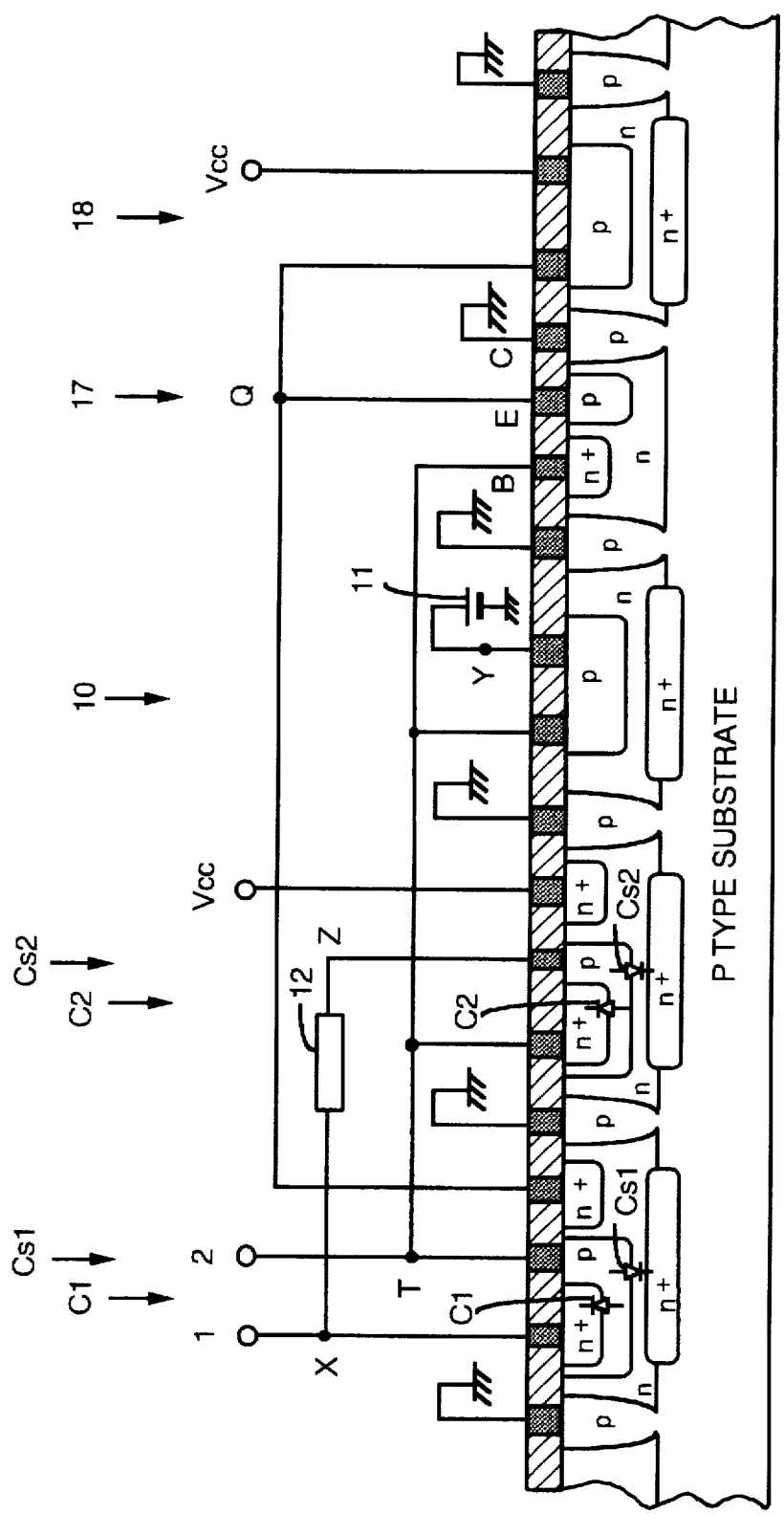
FIG. 18 shows a semiconductor structure where a highpass filter is realized on an integrated circuit substrate according to the fourth embodiment of the invention.

FIG. 16 is a circuit configuration of a highpass filter comprising a parasitic capacitor eliminating circuit according to the fourth embodiment of the present invention. FIG. 17 is a circuit configuration of a highpass filter constructed using a transistor according to the fourth embodiment of the invention. FIG. 18 shows a semiconductor structure where a highpass filter is realized on an integrated circuit substrate according to the fourth embodiment of the invention.

The configuration of FIG. 16 comprises a pnp transistor 17, and a resistor 18. The transistor 17 and the resistor 18 consists of an emitter-follower 30. The emitter of the transistor 17 in the emitter-follower 30 is connected to the power supply 15 via the resistor 18, the base of the transistor 17 which is an input of the emitter-follower 30 is connected to the terminal 2, and the collector of the emitter-follower 17 is grounded.

In the configuration as mentioned above, the one terminal of the parasitic capacitor 19 is connected to the output of the emitter-follower, while the other terminal of it is connected to the input of the emitter-follower (the base of the transistor 17). On this account, the voltage on the respective terminals of the parasitic capacitor (Cs1) 19 is equal to the base-emitter voltage $V_{BE}$, which is always kept constant. Accordingly, the frequency characteristic of the lowpass filter circuit is not affected by the voltage variation, because neither charge nor discharge occurs in the parasitic capacitor 19.

FIG. 17 a circuit configuration of a highpass filter constructed using a transistor according to the fourth embodiment of the invention. In FIG. 17, the collector of a first npn transistor 47 is connected to the emitter of the pnp transistor 17, its emitter is connected to the input terminal 1, and its base is connected to the output terminal 2. On the other hand, the collector of a second npn transistor 48 is connected to the direct current power supply Vcc, its base is connected to the output of the level shift circuit (Z point), and its emitter is connected to the output terminal 2. Since these transistors 47, 48 are so constructed that the electric potential of the respective emitters is higher than that of the respective bases, no current flows through the transistors because the reverse bias is applied to the respective bases. In this state, junction capacitors C1, C2 are formed respectively between the respective bases and the emitters of the transistors 47, 48. Explanation is omitted, in FIG. 17, on those which have the same reference numbers as those in FIG. 16, since they represent the same elements.

FIG. 18 shows a semiconductor structure where a highpass filter is realized on an integrated circuit substrate according to the fourth embodiment. The junction capacitor 8 is defined between a p layer defined on an n layer right above a P type substrate and an n layer defined on the p layer. In other words, the junction capacitor 8 is defined at a place where a diode mark C1 lies in FIG. 18. The junction capacitor 9 is defined on the other part between the p layer defined on the n layer right above the P type substrate and the n layer defined on the p layer. In other words, the junction capacitor 9 is defined at a place where a diode mark C2 lies in FIG. 18. On the other hand, as shown by an arrow R, the resistor 10 is defined in a region which is isolated from the junction capacitors 8, 9 on the p layer which is defined on the n layer right above the P type substrate. The level shift circuit 12 and the constant voltage supply 11 are illustrated in FIG. 18 as they are located in an outside circuit, they are merely illustrated from the convenience of explanation. The level shift circuit 12 and the constant voltage supply 11 can of course be defined on the same P type substrate as the other elements.

On the other hand, the pnp transistor 17 is defined in another region which is isolated from the junction capacitors C1 and C2. In other words, the pnp transistor is defined among an isolation region defined on the P type substrate, an n epitaxial layer, and a p layer which is defined on the n epitaxial layer. The collector of the pnp transistor is grounded, its emitter is connected to the power supply Vcc via a resistor which is defined in the other region, and its base is connected to the output terminal 2.

In addition to the above, the parasitic capacitor Cs2 is formed between the n layer right above the P type substrate and the p layer defined on the n layer in the portion around C2. The parasitic capacitor Cs1 is formed between the n layer right above the P type substrate and the p layer defined on the n layer in the portion around C1. The one terminal of the parasitic capacitor (Cs1) 19 is connected to the output terminal 2, while the other terminal of it is connected to the emitter of the transistor 17. On the other hand, the one terminal of the parasitic capacitor (Cs2) 20 is connected to the output of the level shift circuit and the other terminal of it is connected to the power supply 16.

What is claimed is:

1. A low pass filter circuit comprising:

a signal input terminal, a signal output terminal, and a control voltage supply terminal;

a first resistor having a first terminal connected to the signal input terminal and a second terminal connected to the signal output terminal;

a first junction capacitor having a first variable capacitance, the first junction capacitor being connected between the control voltage supply terminal and the signal output terminal and comprising a first npn transistor having a collector, an emitter, and a base, the collector of the first npn transistor being connected to a direct current power supply, the emitter of the first npn transistor being connected to the control voltage supply terminal, and the base of the first non transistor being connected to the signal output terminal;

a second junction capacitor having a second variable capacitance, the second junction capacitor being connected between the signal output terminal and ground and comprising a second an npn transistor having a collector, an emitter, and a base, the collector of the second npn transistor being connected to the direct current power supply, the base of the second npn transistor being grounded, and the emitter of the second npn transistor being connected to the signal output terminal;

a second resistor; and a pnp transistor having a collector, a base, and an emitter, the emitter of the pnp transistor being connected to the direct current power supply via the second resistor, the collector of the pnp transistor being grounded, and the base of the pnp transistor being connected to the signal output terminal.

2. A high pass filter circuit comprising:

a signal input terminal and a signal output terminal;

a first junction capacitor having first and second terminals, the first terminal of the first junction capacitor being connected to the signal input terminal the second terminal of the first junction capacitor being connected to the signal output terminal;

a level shift circuit having an input terminal and an output terminal, the input terminal being connected to the signal input terminal;

a second junction capacitor having first and second terminals, the first terminal of the second junction capacitor being connected to the output terminal of the level shift circuit the second terminal of the second junction capacitor being connected to the signal output terminal; and a serial circuit connected between the signal output terminal and ground, the serial circuit including a first resistor and a constant voltage supply.

3. The high pass filter circuit according to claim 2 further comprising:

a direct current power supply, and wherein:

the first junction capacitor comprises a first npn transistor having a collector, a base, and an emitter, the collector of the first npn transistor being connected to the direct current power supply, the emitter of the first npn transistor being connected to the signal input terminal, and the base of the first npn transistor being connected to the signal output terminal; and the second junction capacitor comprises a second npn transistor having a collector, a base, and an emitter, the collector of the second npn transistor being connected to the direct current power supply, the base of the second npn transistor being connected to the level shift circuit, the emitter of the second npn transistor being connected to the signal output terminal.

4. The high pass filter circuit according to claim 3 further comprising:

a second resistor; and a pnp transistor having a collector, a base, and an emitter, the emitter of the pnp transistor being connected to the direct current power supply via the second resistor, the collector of the pnp transistor being grounded, and the base of the pnp transistor being connected to the signal output terminal.

5. The high-pass filter circuit according to claim 3 wherein the level shift circuit comprises:

a third npn transistor having a collector, a base, and an emitter, the base of the third npn transistor being connected to the input terminal of the level shift circuit, and the collector of the third npn transistor being connected to the direct current power supply;

at least one diode being connected in series with the third npn transistor, the diode having an anode and a cathode, the anode being connected to the emitter of the third npn transistor; and a constant current supply having first and second terminals, the first terminal of the constant current supply being connected to the output terminal of the level shift circuit and to the cathode of the diode, the second terminal being connected to ground.

6. The high-pass filter circuit according to claim 4 wherein the level shift circuit comprises:

a third npn transistor having a collector, a base, and an emitter, the base of the third npn transistor being connected to the input terminal of the level shift circuit, and the collector of the third npn transistor being connected to the direct current power supply;

at least one diode being connected in series with the third npn transistor, the diode having an anode and a cathode, the anode being connected to the emitter of the third npn transistor; and a constant current supply having first and second terminals, the first terminal of the constant current supply being connected to the cathode of the diode and to the output terminal of the level shift circuit, the second terminal of the constant current supply being connected to ground.

* * * * *

UNITED STATES PATENT AND TRADEMARK OFFICE
CERTIFICATE OF CORRECTION

PATENT NO. : 5,760,642
DATED : June 2, 1998
INVENTOR(S) : Yada

It is certified that error appears in the above-identified patent and that said Letters Patent is hereby corrected as shown below:

Column 12, Line 16, change "non" to --npn--;

Line 21, delete --an--;

Line 48, after "circuit" insert --,--.

Signed and Sealed this

Twentieth Day of October, 1998

Attest:

BRUCE LEHMAN

*Attesting Officer*  *Commissioner of Patents and Trademarks*